(12) United States Patent
Ullmann

(10) Patent No.: US 7,944,312 B2
(45) Date of Patent: May 17, 2011

(54) ACTIVE FREE-RUNNING FREQUENCY CIRCUIT FOR PHASE-LOCKED LOOP APPLICATIONS

(75) Inventor: Igor Ullmann, Villach (AT)

(73) Assignee: Infineon Technologies AG, Neubiberg (DE)

( * ) Notice: Subject to any disclaimer, the term of this patent is extended or adjusted under 35 U.S.C. 154(b) by 185 days.

(21) Appl. No.: 12/370,567

(22) Filed: Feb. 12, 2009

(65) Prior Publication Data
US 2010/0201404 A1 Aug. 12, 2010

(51) Int. Cl.
*H03L 7/085* (2006.01)

(52) U.S. Cl. ................... 331/17; 331/8; 331/25
(58) Field of Classification Search ............ 331/1 A, 331/8, 16–18, 25; 327/156–159; 332/127; 360/51; 375/376; 455/260
See application file for complete search history.

(56) References Cited

U.S. PATENT DOCUMENTS
4,689,581 A * 8/1987 Talbot ................... 331/1 A
* cited by examiner

*Primary Examiner* — David Mis
(74) *Attorney, Agent, or Firm* — Lee & Hayes, PLLC

(57) ABSTRACT

This disclosure relates to a Phase-Locked Loop (PLL) device and a method for providing a stable free-running voltage signal to a voltage controlled oscillator.

17 Claims, 4 Drawing Sheets

# ACTIVE FREE-RUNNING FREQUENCY CIRCUIT FOR PHASE-LOCKED LOOP APPLICATIONS

BACKGROUND

A Phase-Lock Loop circuit, or PLL, is often used for controlling the frequency of a signal within an electrical circuit. The PLL is typically comprised of a phase detector, a low pass filter, a voltage controlled oscillator ("VCO") or a current controlled oscillator ("CCO"), and a feedback path from the oscillator to the phase detector. The feedback path may also contain a frequency divider component. Generally, a PLL is used in fully integrated or partly integrated applications, such as high-speed clock data recovery, frequency synthesizers, clock generators, and clock distribution. Analog PLL designs are often built with a current controlled oscillator that is merely controlled by a simple input current branch. A free-running frequency (i.e., the frequency at which a normally driven oscillator operates in the absence of a driving signal) of the oscillator is maintained by using a simple constant-current injection branch (providing current signal $I_{const}$) in parallel with a control-current branch (providing current signal $I_{cont}$) The overall current ($I_{sum}$) received as an input by the current controlled oscillator is based upon the sum of the constant-current signal $I_{const}$ and the control-current signal $I_{cont}$. As a result, if the control-current $I_{cont}$ reaches zero (i.e. no current), the constant-current $I_{const}$ ensures the oscillator is still receiving current and, thus, delivering a free running frequency signal ($F_{free}$). Unfortunately, the adjustment for a constant free-running frequency of a voltage controlled oscillator (VCO) based PLL has been more complicated than that for a current controlled oscillator due to the lack of a constant-current injection in the VCO.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different instances in the description and the figures may indicate similar or identical items.

DETAILED DESCRIPTION

Figure 1:
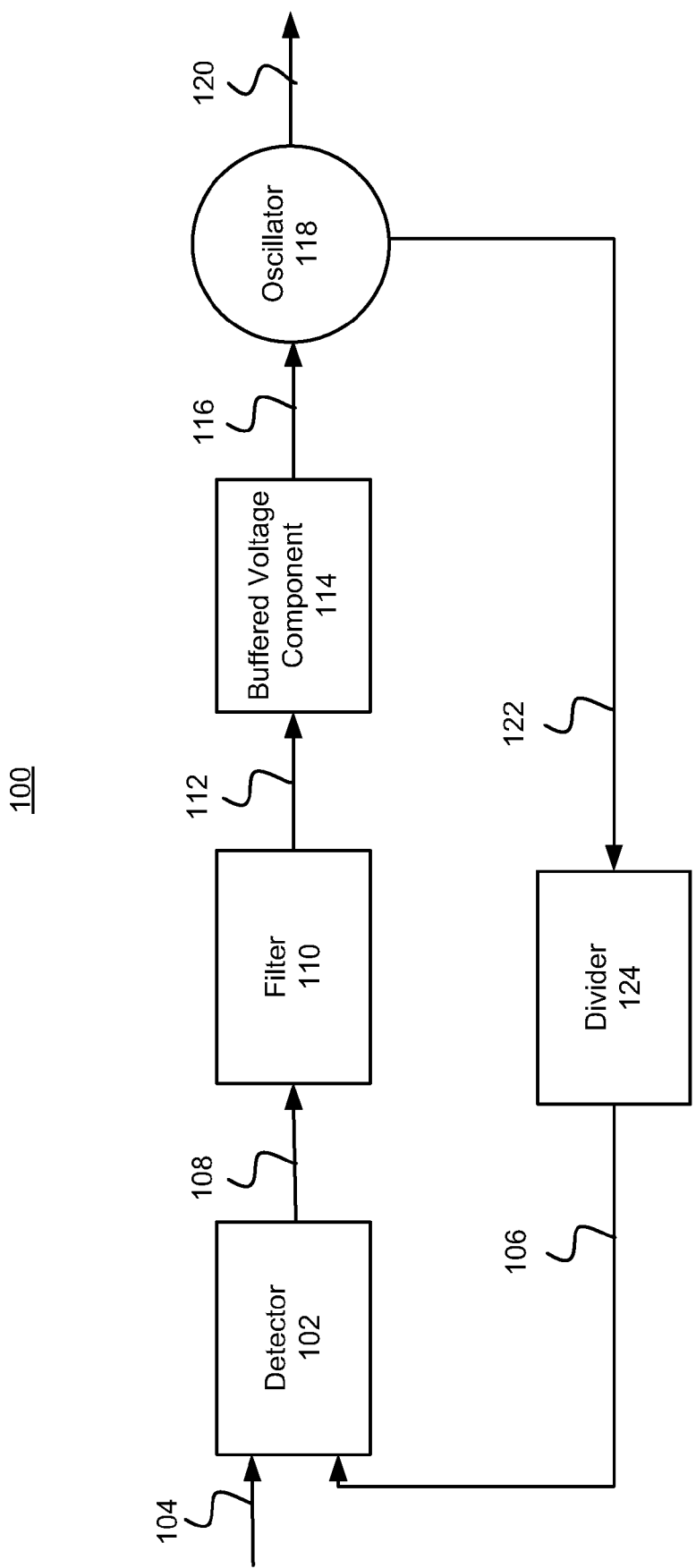
FIG. 1 is a flow diagram of a Phase-Locked Loop device that encompasses an implementation of the invention.

Disclosed herein is a device that provides a buffered control voltage signal or a buffered constant voltage signal to a voltage controlled oscillator and a method for operating the device that can be used in a phase-locked loop ("PLL") control system.

According to one implementation, a PLL contains a buffered voltage component in addition to a phase detector component, a filter component, an oscillator component, and a divider component. The buffered voltage component is located between the filter component and the oscillator component. The buffered component is operable to provide a constant free-running voltage signal to the oscillator component, which is a voltage controlled oscillator ("VCO"). The free-running voltage signal enables the VCO to maintain a constant free-running frequency when the PLL is not in a locked state.

In another implementation, a buffered voltage device is configured to receive a filtered signal from a filter component and to provide a buffered signal to an oscillator component. The buffered voltage device includes a control signal component and a constant signal component. The control signal component output terminal and the constant signal component output terminal are electrically coupled. Additionally, output terminals of the control signal component and the constant signal component are electrically coupled to the output terminal of the buffered voltage device. The control signal component is configured to receive the filtered signal and provide a control signal to the output terminal of the buffered voltage device. The constant signal component is configured to receive a constant, or free-running, voltage signal and provide the constant signal to the output terminal of the buffered voltage device. The buffered voltage device provides the output signal of the control signal component to the oscillator when the voltage of the output signal of the control signal component is greater than the voltage of the output signal of the constant signal component. However, the buffered voltage device provides the output signal of the constant signal component to the oscillator when the voltage of the output signal of the constant signal component is greater than the voltage of the output signal of the control signal component.

In one implementation, the control signal component of the buffered voltage device contains a differential amplifier and pass transistor that controls the output of the differential amplifier. The first input terminal of the differential amplifier is configured to receive a filtered signal. The second input terminal of the differential amplifier is connected in a feedback configuration to the output terminal of the differential amplifier and thereby receives the buffered control voltage signal that is output by the control signal component. The source terminal of the transistor provides the output of the control signal component, the drain terminal is connected to a power supply, and the gate terminal is connected to the output terminal of the differential amplifier.

Similarly, the constant signal component of the buffered voltage component contains a differential amplifier and a pass transistor to control the output of the differential amplifier. The first input terminal of the constant signal differential amplifier is configured to receive a constant voltage signal, while the second input terminal is connected in a feedback configuration to the output terminal of the differential amplifier. The source terminal of the transistor provides the output of the constant signal component, the drain terminal is connected to a power supply, and the gate terminal is connected to the output terminal of the constant signal differential amplifier.

A method is also disclosed for operating a buffered voltage device as described above. A buffered voltage device will process a filtered signal in a first differential amplifier that outputs a buffered control voltage signal. A second differential amplifier will process a constant voltage signal provided by the buffered voltage device and output a buffered constant voltage signal. A path to an electrically common terminal is provided for the buffered control voltage signal and the buffered constant signal. The common terminal is electrically coupled to the output terminal of the buffered voltage device. The output terminal of the buffered voltage device provides a buffered signal to an oscillator. The buffered signal is the buffered control voltage signal if the voltage of the buffered control voltage signal is greater than the voltage of the buffered constant voltage signal. However, the buffered signal may be the buffered constant voltage signal if the voltage of the buffered constant voltage signal is greater than the voltage of the buffered control voltage signal.

Exemplary Devices and Methods

FIG. 1 depicts a block diagram for a PLL device 100 comprising a phase detector 102 configured to receive an input frequency signal along path 104 and a divided frequency output signal along feedback path 106. The phase detector 102 generates a voltage signal along path 108 that represents the difference in phase between the input frequency signal and the divided frequency output signal. The voltage signal along 108 is provided to the low pass filter 110, which filters the voltage signal along path 108 and transforms it to a filtered voltage signal along path 112. The buffered voltage component 114 transforms the filtered voltage signal along path 112 to a buffered control voltage signal along path 116. The buffered control voltage signal along path 116 is provided to an input terminal of an oscillator 118, such as a voltage control oscillator, which provides the frequency output signal along path 120. The oscillator 118 also provides frequency output signal along feedback path 122 to a frequency divider component 124, which generates the divided frequency output signal along feedback path 106. If the buffered voltage component does not receive a signal along path 112, the buffered voltage component will provide a constant, or free-running, signal to the oscillator 118.

Figure 2:
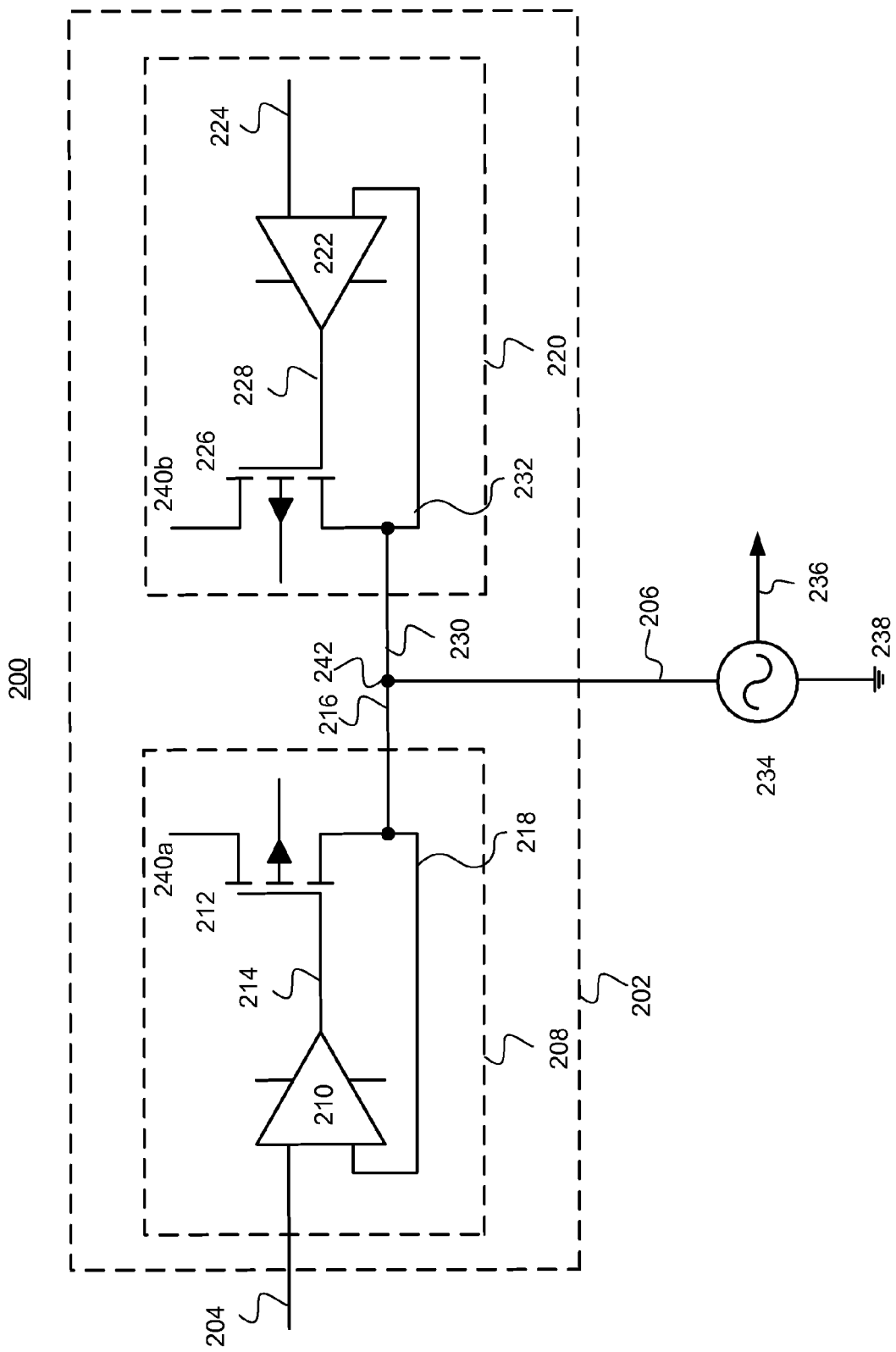
FIG. 2 is a circuit diagram of an implementation of the invention.

FIG. 2 depicts a circuit diagram of a portion 200 of a PLL 100, including a buffered voltage component 202 (which may correspond to buffered voltage component 114) and a voltage controlled oscillator 234 (which may correspond to oscillator 118). The buffered voltage component 202 is configured to receive the filtered signal along path 204 and provides as an output a buffered control voltage signal along path 206. The buffered voltage component 202 may be comprised of a control signal component 208 and a constant signal component 220. The outputs of both components are electrically coupled to a node 242 that is also connected to the output path 206 of the buffered voltage component.

The control signal component 208 may include a differential amplifier 210 and a pass transistor 212. The differential amplifier 210 is configured to receive the filtered signal along path 204 and a buffered control voltage signal received along feedback path 218 and, in response, to produce a buffered control voltage signal along path 214, which is provided to the gate terminal of the pass transistor 212. The pass transistor may include any type of transistor, e.g., N-MOSFET, P-MOSFET, CMOS, BiPolar, BiCMOS, and so forth. The pass transistor 212 is configured to receive a supply voltage 240a at its drain terminal and to provide the output signal, along path 216, of the control signal component.

The constant signal component 220 may include a differential amplifier 222 and a pass transistor 226. The differential amplifier 222 is configured to receive a constant voltage signal along path 224 and a buffered constant voltage signal along feedback path 232 to produce a buffered constant voltage signal along path 228, which is provided to the gate terminal of the control signal component transistor 226. The pass transistor 226 is configured to receive a supply voltage 240b at its drain terminal and to provide the output signal, along path 230, of the constant signal component.

The buffered signal along path 206 will be the higher of the two voltage values between the buffered control voltage signal along path 216 and the buffered constant voltage signal along path 230. If the buffered control voltage signal along path 216 is greater than the buffered constant voltage along path 230, the buffered control voltage signal along path 216 will drive the voltage controlled oscillator 234 to produce the output frequency signal along path 236. On the other hand, if the buffered constant voltage along path 230 is greater than the buffered control voltage signal along path 216, the buffered constant voltage signal along path 230 will drive the voltage controlled oscillator 234 to produce the output frequency signal along path 236.

Figure 3:
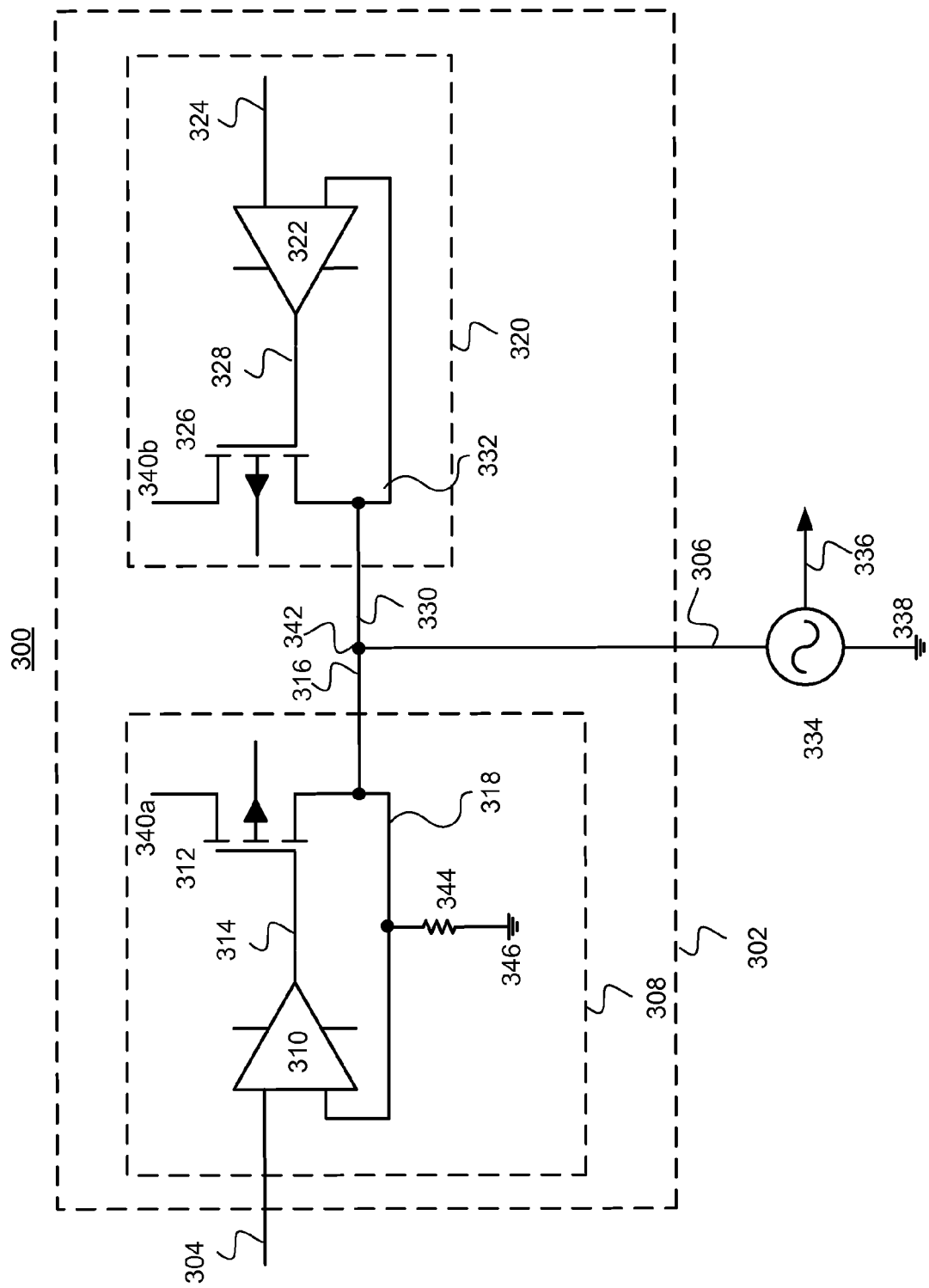
FIG. 3 is a circuit diagram of another implementation of the invention.

FIG. 3 depicts another implementation for a circuit diagram of a portion 300 of a PLL 100. Portion 300 is identical to portion 200 expect for control signal component 208 is replaced with control signal component 308. Like control signal component 208, control signal component 308 may include a control signal component differential amplifier 310, a transistor 312 with a source terminal configured to provide a buffered control voltage signal along path 316 to the input terminal of the voltage controlled oscillator 334. However, unlike control signal component 208, control signal component 308 includes a load element 344 in the feed back path 318, which may be connected to a to reference or ground 346. Although a resistor is shown, any constant current sink (or source) or a passive load (e.g., a resistor, etc.) may be additionally or alternatively included and may set the output quiescent current of the differential amplifier. Moreover, although the load is shown with reference to the control component 308, a similar load may be added to constant component 220.

Figure 4:
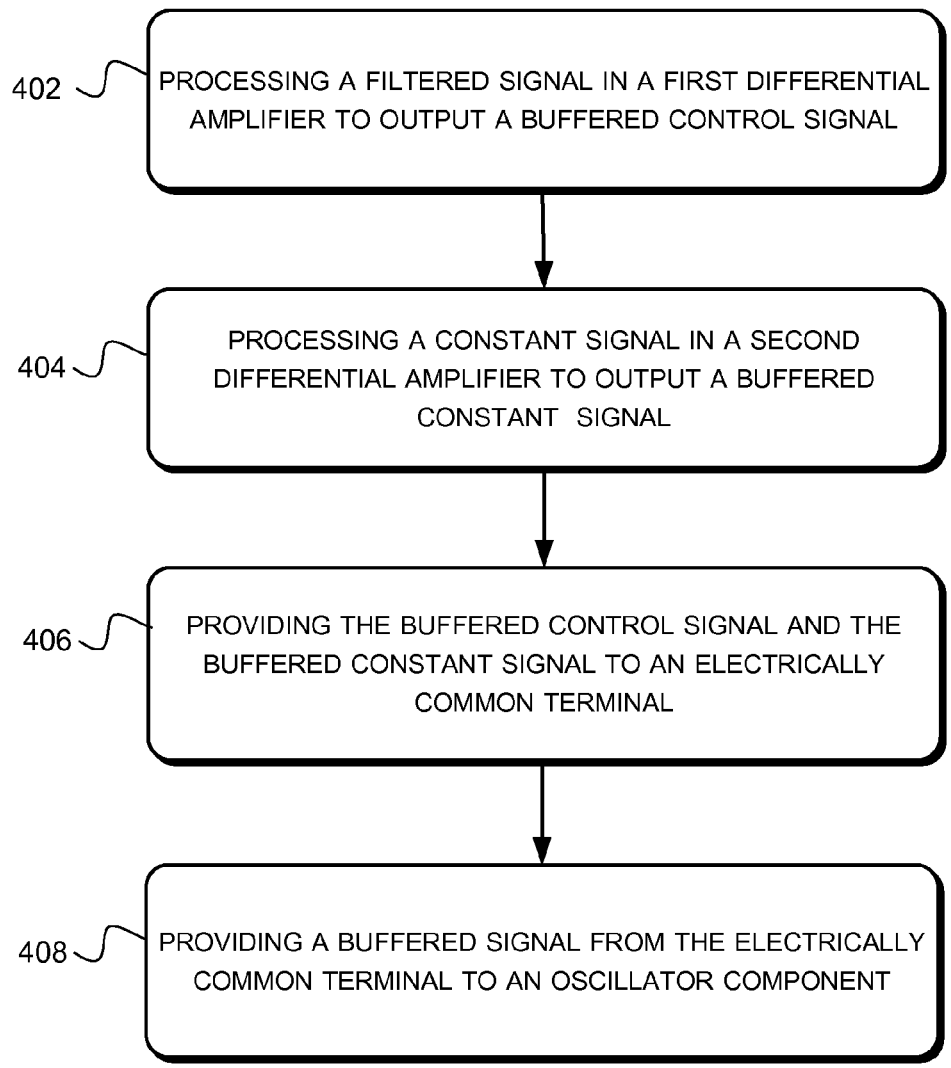
FIG. 4 is a diagram for a method for providing a constant free-running voltage to a VCO.

FIG. 4 depicts a flow diagram 400 for a method for providing a control voltage or a constant free-running voltage to a VCO. Specifics of exemplary methods are described below. The process is illustrated as a collection of referenced acts arranged in a logical flow graph, which represent a sequence that can be implemented in hardware, software, or a combination thereof. The order in which the acts are described is not intended to be construed as a limitation, and any number of the described acts can be combined in any order and/or in parallel to implement the method 400.

At 402, a filtered signal is processed in a first differential amplifier to output a buffered control voltage signal. According to one implementation, shown in FIG. 2, the first differential amplifier 210 may be located in a buffered voltage component 202. The first amplifier 210 may be configured to receive buffered control voltage signal received along feedback path 218 and a filtered signal along path 204. The differential amplifier compares the filtered signal to a fed back buffered control voltage signal along path 218 and generates a buffered control voltage signal along path 214 using negative feedback control. Negative feedback control reduces output signal instability by adjusting the input signal to account for instability in the output signal. This may be accomplished by feeding back the output signal, inverting the output signal and comparing it to the input signal. Differential amplifiers, or buffer amplifiers (e.g. 210), can be used to accomplish negative feedback control. However, negative feedback control may be accomplished using various other electronic devices or a combination of electronic devices as is well understood by a person of ordinary skill in the art.

At 404, a constant voltage signal is processed in a second differential amplifier to output a buffered constant voltage signal. In one implementation, a constant signal component 220 operates in a similar fashion as described above with regard to step 404. However, the negative feedback component, such as differential amplifier 222, receives and compares a constant voltage signal along path 224 and a buffered constant voltage signal along feedback path 232.

At 406, the buffered control voltage signal and the buffered constant voltage signal are provided to an electrically common terminal. In one implementation, the signal path 216 of the buffered control voltage signal is connected to the signal path 230 of the buffered constant voltage signal before reaching the buffered signal path 206. The common terminal may be a node or other common connection, or may be a comparator as would be appreciated by one skilled in the art.

At 408, a buffered signal is provided from the electrically common terminal to an oscillator component. In one implementation, whichever of the buffered control voltage signal along path 216 and buffered constant voltage signal along path 230 has the higher voltage magnitude will dominate the signal along the path 206 to oscillator component 234.

Conclusion

The above described device and method enable creating for providing a stable free-running frequency signal to a voltage controlled oscillator that is not impacted by process or temperature dependencies of the transistors in the device. Although the device and method has been described in language specific to structural features and/or methodological acts, it is to be understood that the system and method defined in the appended claims is not necessarily limited to the specific features or acts described. Rather, the specific features and acts are disclosed as exemplary forms of implementing the claimed system and method.

The invention claimed is:

1. A device comprising:
a filter component;
a buffered voltage component configured to receive a filtered signal from the filter component, the buffered voltage component comprising:
a control signal component; and
a constant signal component including an output terminal of the constant signal component coupled to an output terminal of the control signal component; and
an oscillator component configured to receive a buffered signal from the buffered voltage component.

2. The device according to claim 1, wherein:
the control signal component comprises a differential amplifier configured to process the filtered signal and output a buffered control signal; and
the constant signal component comprises a differential amplifier configured to process a constant voltage signal and output a buffered constant voltage signal.

3. The device according to claim 1, wherein the buffered signal is a buffered control signal or a buffered constant voltage signal.

4. A device comprising:
a control signal component having an amplifier configured to receive a filtered signal and provide a buffered control signal to a node; and
a constant signal component having an amplifier configured to receive a constant voltage signal and provide a buffered constant signal to the node.

5. The device according to claim 4, further comprising:
a buffered signal provided from an output terminal of the device is the buffered control signal when the voltage of the buffered control signal is equal to or greater than the voltage of the buffered constant signal.

6. The device according to claim 4, wherein:
the amplifier in the control signal component is a differential amplifier configured to receive the filtered signal into a first input and an output signal of the differential amplifier into a second input of the differential amplifier; and
the amplifier in the constant signal component is a differential amplifier configured to receive a constant voltage signal into a first input and an output signal of the differential amplifier into a second input the differential amplifier.

7. The device according to claim 6, wherein the output signal of the differential amplifier in the control signal component is controlled by a pass transistor.

8. The device according to claim 6, wherein the output signal of the differential amplifier in the constant signal component is controlled by a pass transistor.

9. The device according to claim 5, wherein the buffered signal provided from the output terminal of the device is the buffered constant signal when the voltage of the buffered constant signal is greater than the voltage of the buffered control signal.

10. The device according to claim 6, wherein the buffered control signal is provided to the differential amplifier along a feedback path, the feedback path is coupled a load element that controls the quiescent current of the differential amplifier.

11. The device according to claim 10, wherein the load element is a current sink or a resistor.

12. A method comprising:
processing a filtered signal in a first differential amplifier to output a buffered control signal;
processing a constant voltage signal in a second differential amplifier to output a buffered constant signal;
providing the buffered control signal and the buffered constant signal to an electrically common terminal; and
providing a buffered signal from the electrically common terminal to an oscillator component.

13. A method according to claim 12, wherein the buffered signal is the buffered control signal when the voltage of the buffered control signal is greater than or equal to the voltage of the buffered constant signal.

14. A method according to claim 12, wherein the buffered signal is the buffered constant signal if the voltage of the buffered constant signal is greater than the voltage of the buffered control voltage.

15. A device comprising:
a first differential amplifier having a first input terminal configured to receive a filtered signal and a second input terminal configured to receive a signal output by the first differential amplifier;
a second differential amplifier having a first input terminal configured to receive a constant voltage signal and a second input terminal configured to receive a signal output by the second differential amplifier; and
an electrically common terminal configured to receive the signals output by the first and second differential amplifiers and to provide the signal output by the first differential amplifier or the second differential amplifier to an oscillator.

16. The device according to claim 15, wherein the output signal output of the first differential amplifier is provided to the oscillator when the voltage of the output signal of the first differential amplifier is greater than the voltage of the output signal of the second differential amplifier.

17. The device according to claim 15, wherein the output signal of the second differential amplifier is provided to the oscillator when the voltage of the output signal of the second differential amplifier is greater than the voltage of the output signal of the first differential amplifier.

* * * * *